United States Patent
Wrobel et al.

(10) Patent No.: US 10,483,663 B2
(45) Date of Patent: Nov. 19, 2019

(54) TERMINAL BLOCK WITH RETENTION FEATURES FOR A REMOVABLE I/O MODULE

(71) Applicant: Rockwell Automation Asia Pacific Business Center Pte. Ltd., Singapore (SG)

(72) Inventors: Adam M. Wrobel, Gates Mills, OH (US); Douglas A. Lostoski, Richfield, OH (US); Nathan J. Molnar, Shaker Heights, OH (US)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 0 days.

(21) Appl. No.: 16/186,037

(22) Filed: Nov. 9, 2018

(65) Prior Publication Data
US 2019/0140373 A1 May 9, 2019

Related U.S. Application Data

(60) Provisional application No. 62/583,710, filed on Nov. 9, 2017.

(51) Int. Cl.
*H01R 9/16* (2006.01)
*H01R 9/24* (2006.01)
*H05K 7/14* (2006.01)

(52) U.S. Cl.
CPC ............ *H01R 9/16* (2013.01); *H01R 9/24* (2013.01); *H05K 7/1469* (2013.01); *H01R 9/2425* (2013.01)

(58) Field of Classification Search
CPC .. H05K 7/1474; H05K 7/1468; H01R 9/2675; H01R 9/2658; H01R 9/2616; H01R 9/2633; H01R 9/2666; H01R 9/2683; H01R 9/2691
See application file for complete search history.

(56) References Cited

U.S. PATENT DOCUMENTS

| | | | | |
|---|---|---|---|---|
| 5,629,831 | A | * 5/1997 | Eggert | H01R 9/2658 361/624 |
| 6,027,380 | A | * 2/2000 | Hanning | H01R 9/2608 439/716 |
| 7,980,891 | B2 | 7/2011 | Molnar | |
| 8,066,239 | B2 | 11/2011 | Molnar et al. | |
| 9,325,110 | B2 | 4/2016 | Lostoski et al. | |

* cited by examiner

*Primary Examiner* — Ross N Gushi
(74) *Attorney, Agent, or Firm* — Fay Sharpe LLP

(57) ABSTRACT

An input/output device includes a terminal base to be mounted to a structure. A terminal block is connected to the terminal base and includes wiring terminals to be connected to I/O field wiring. A latch body is connected to the terminal block. The latch body is manually movable between an unlatched position and a latched position. An input/output module is connected to the terminal base adjacent the terminal block and includes a locking tab. The latch body, when in the latched position, engages the locking tab and captures the input/output module to the terminal block. The terminal block includes first and second module retaining rails or projections that engage respective slots of the input/output module to restrain the module relative to the terminal base. The terminal base includes first and second notches that receive inner ends of the first and second module retaining projections to rigidify the terminal base.

19 Claims, 8 Drawing Sheets

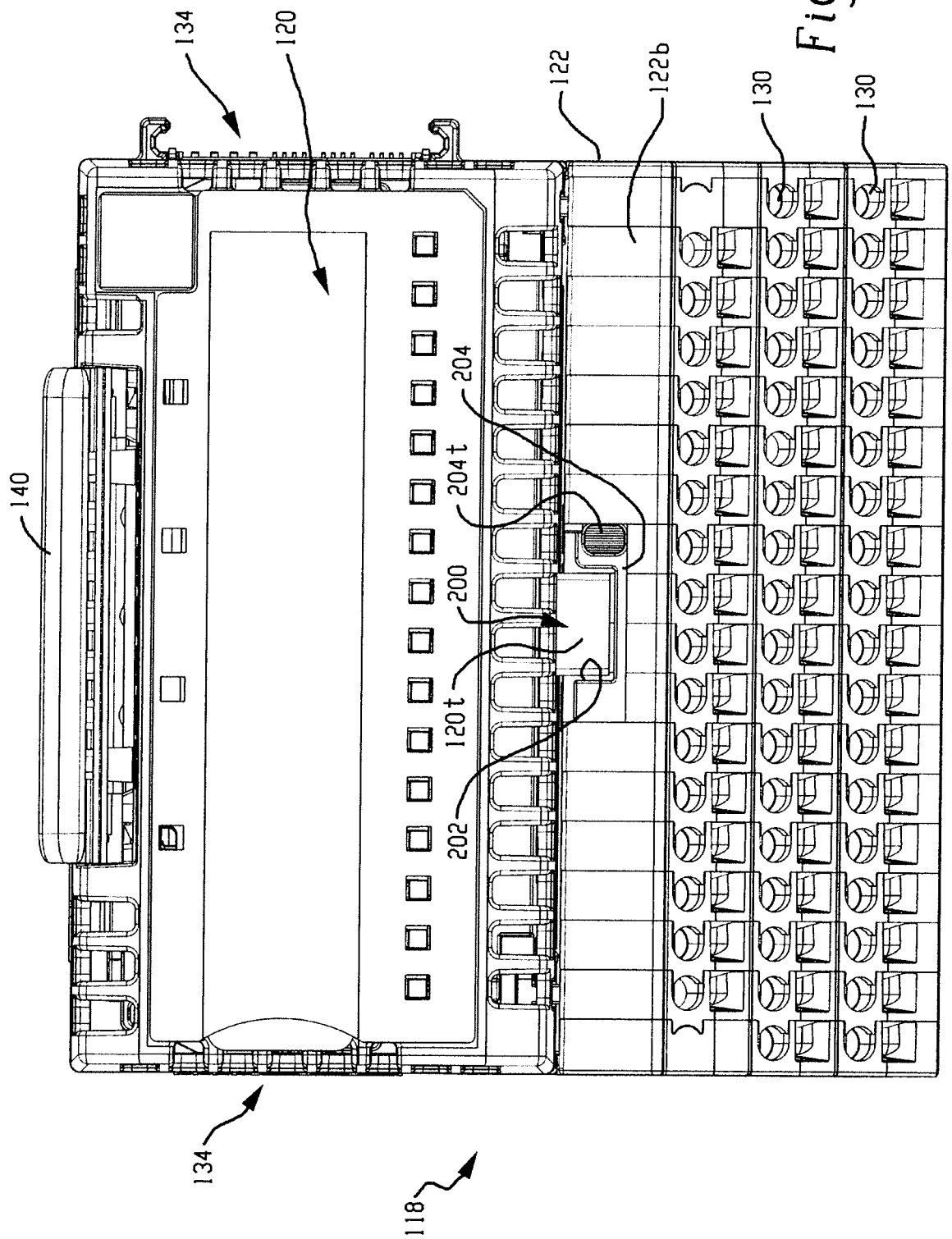

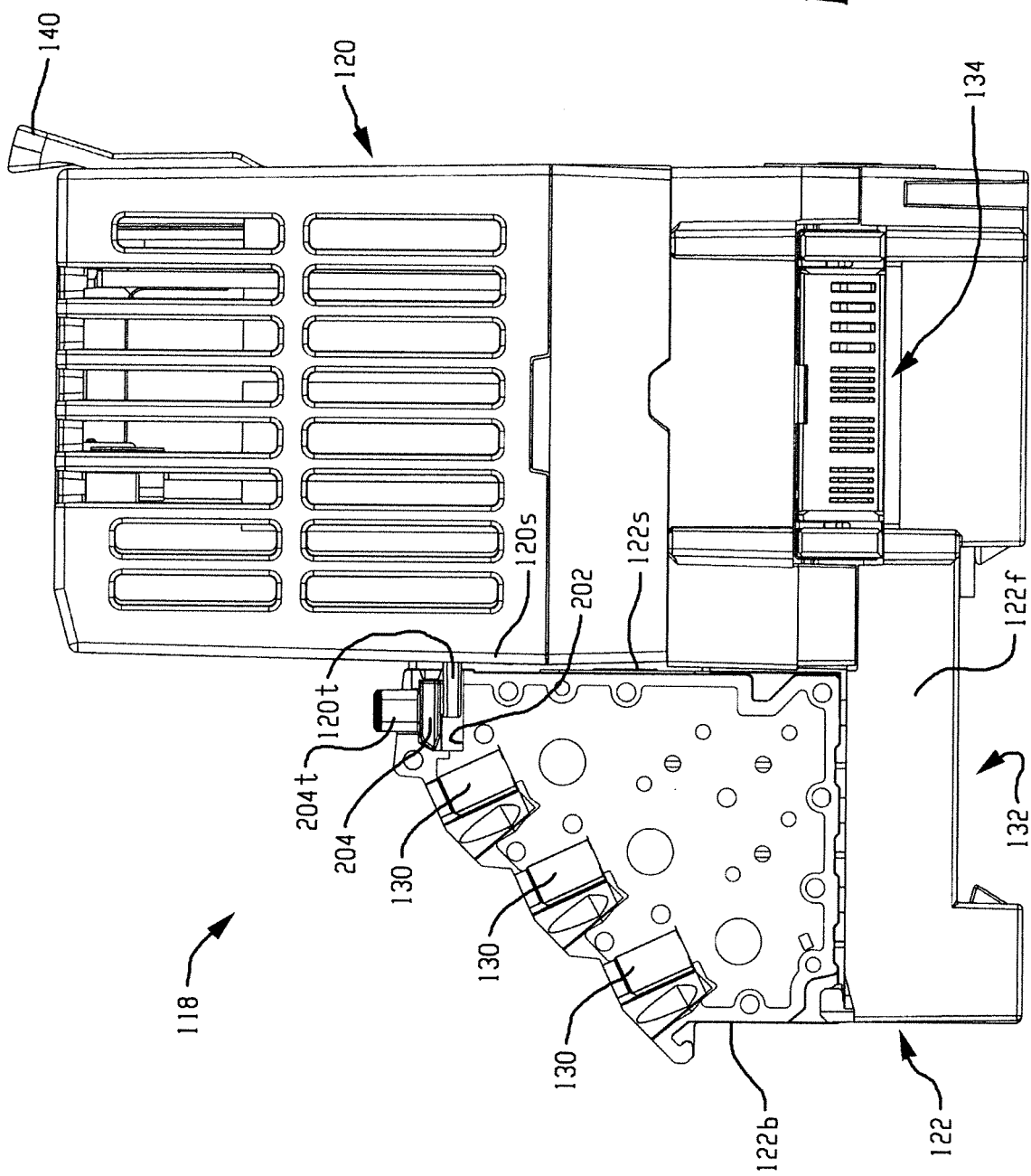

TERMINAL BLOCK WITH RETENTION FEATURES FOR A REMOVABLE I/O MODULE

CROSS-REFERENCE TO RELATED APPLICATION

This application claims priority from and benefit of the filing date of U.S. provisional patent application Ser. No. 62/583,710 filed Nov. 9, 2017, and the entire disclosure of said provisional application is hereby expressly incorporated by reference into the present specification.

BACKGROUND INFORMATION

U.S. Pat. No. 9,325,110 is entitled "Input/Output Module" and discloses, among other things, an input/output (I/O) device 18 for an automation control system. The I/O device 18 includes an I/O module 20 operatively secured to a terminal base 22 using a latching mechanism including a latch element 70 with latching hooks/extensions 50 and a release lever 40 that selectively resiliently deflects the latch element 70 from its normal latched position to an unlatched position to release the latching extensions 50 from the terminal base 22. When the latch element 70 is in its latched position, the latching extensions 50 thereof engage the terminal base 22 to secure the I/O module 20 to the terminal base 22. When the latch element 70 is in its unlatched position, the latching extensions 50 thereof are disengaged from the terminal base 22 and the I/O module 20 can be separated from the terminal base 22.

The present development as disclosed herein provides an I/O device that is similar to the I/O device 18 described above but that comprises alternative and/or additional structures and mechanisms for retaining an I/O module to a terminal base and for increasing the rigidity of the I/O device overall.

SUMMARY

In accordance with a first aspect of the present development, an input/output device includes a terminal base adapted to be mounted to an associated support structure. A terminal block is connected to the terminal base and includes a plurality of wiring terminals adapted to be electrically connected to associated input/output device field wiring. A latch includes a latch body connected to the terminal block. The latch body is manually movable to and between an unlatched position and a latched position. An input/output module is connected to the terminal base adjacent the terminal block. The input/output module includes a locking tab connected thereto. The latch body, when in the latched position, engages the locking tab of the input/output module and captures the input/output module to the terminal block. The latch body, when in the unlatched position, is disengaged from the locking tab to allow said input/output module to be disconnected from said terminal block.

In accordance with another aspect of the present development, a terminal base for an I/O device includes a terminal block including a plurality of wiring terminals adapted to be electrically connected to associated input/output device field wiring. A latch is provided on the terminal block. The latch includes: (i) a slot provided on the terminal block; and (ii) a latch body located in the slot. The latch body is manually movable to and between an unlatched position and a latched position. The latch body obstructs the slot when the latch body is located in the latched position, and the latch body is at least partially withdrawn from the slot to open the slot when the latch body is located in its unlatched position.

BRIEF DESCRIPTION OF THE DRAWINGS

FIGS. 1A and 1B are respective isometric and front views of an I/O device according to the present development, with the latch in its unlatched position for removal or installation of the I/O module;

FIG. 3 is a side view of the I/O device of FIG. 1A, with only the terminal base portion thereof sectioned to reveal the operation of the latch;

DETAILED DESCRIPTION

The entire disclosure of U.S. Pat. No. 9,325,110 is hereby expressly incorporated by reference into the present specification. An input/output (I/O) device 118 according to the present development is described below with reference to FIGS. 1-6. Except as otherwise shown and/or described herein, the I/O device 118 is the same as the I/O device 18 described in U.S. Pat. No. 9,325,110 (the '110 patent). Accordingly, structures and features of the I/O device 118 that correspond to structures and features of the I/O device 18 of the '110 patent are identified herein using reference numbers that are 100 greater than those used in the '110 patent.

Figure 1A:
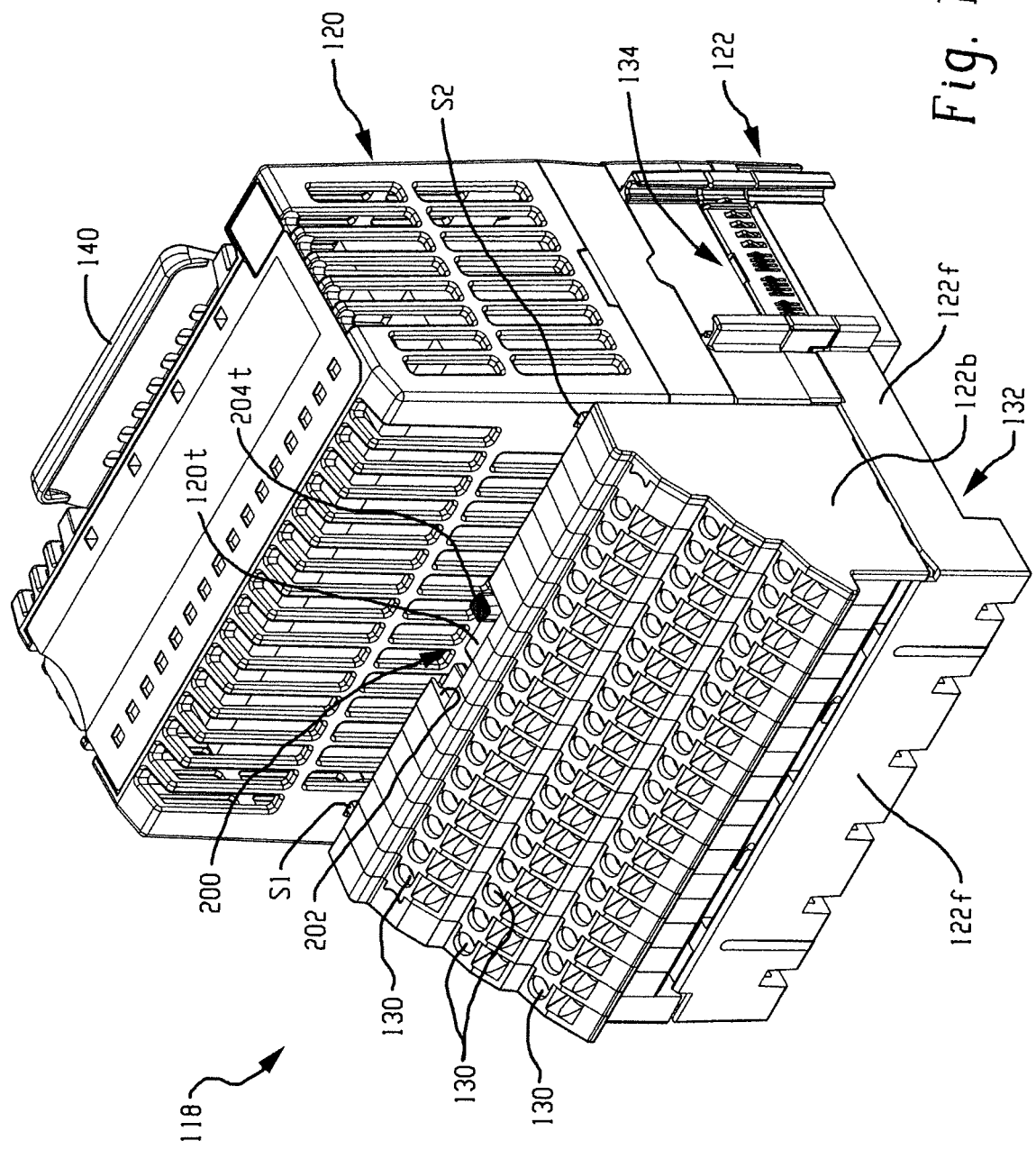

Referring specifically to FIGS. 1A-2B, unlike the I/O device 18 of the '110 patent, the I/O device 118 of the present development includes a movable latch 200 for selectively retaining the I/O module 120 in its operative installed position on the terminal base 122. In the illustrated embodiment, the movable latch 200 is a sliding latch (or "slider") that moves only in a reciprocal linear sliding manner along a latching axis LX (FIGS. 2B & 5), but the latch 200 can alternatively rotate, pivot, and/or otherwise move between its latched and unlatched positions. FIGS. 1A and 1B are respective isometric and front views of the I/O device 118, showing the movable latch 200 thereof located in its unlatched position that allows the I/O module 120 to be installed onto or removed from the terminal base 122.

Figure 2A:
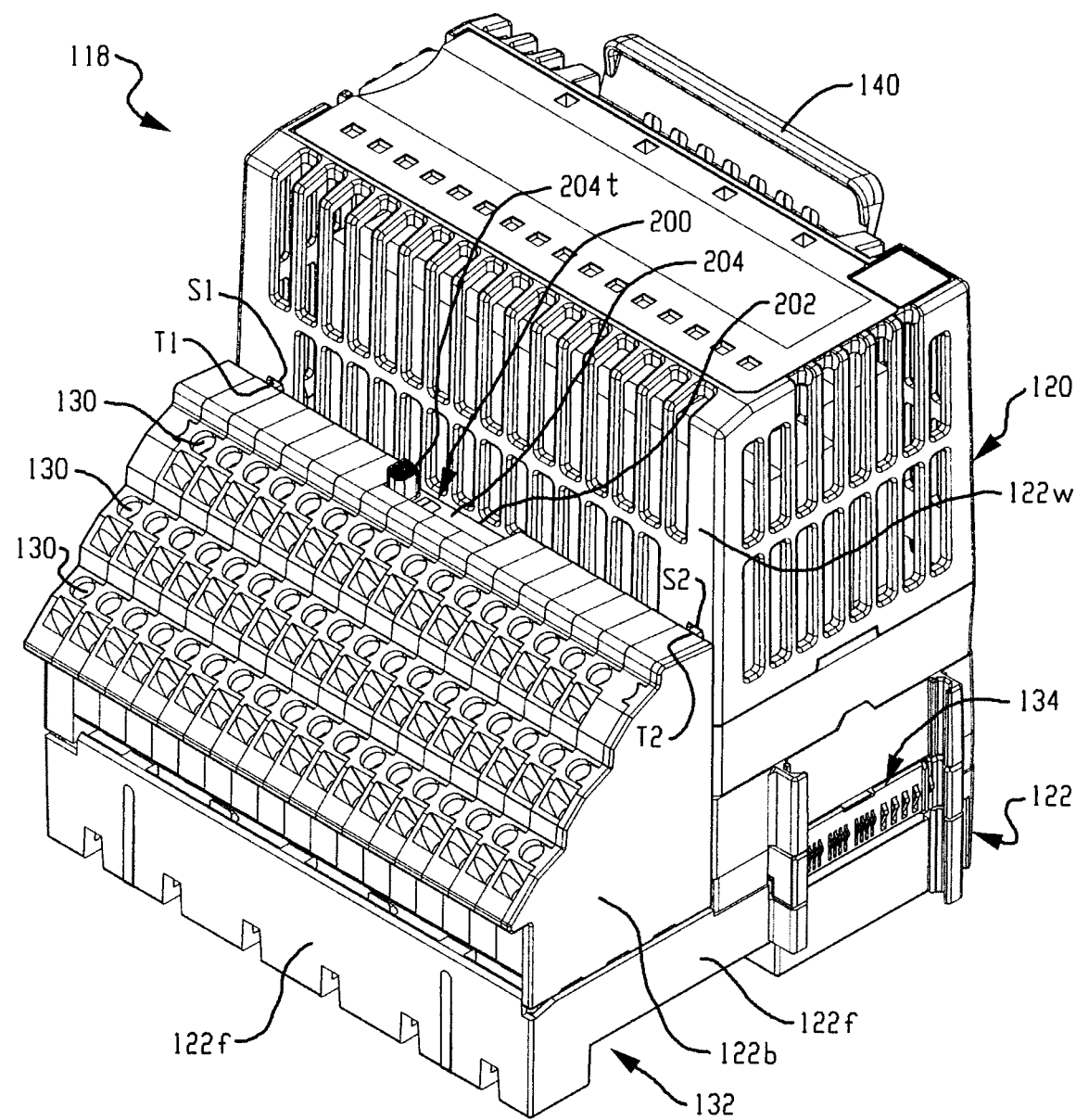
FIGS. 2A and 2B correspond respectively to FIGS. 1A and 1B, but show the latch in it latched position in which the latch captures the I/O module in its installed operative position on the terminal base.
Figure 2B:
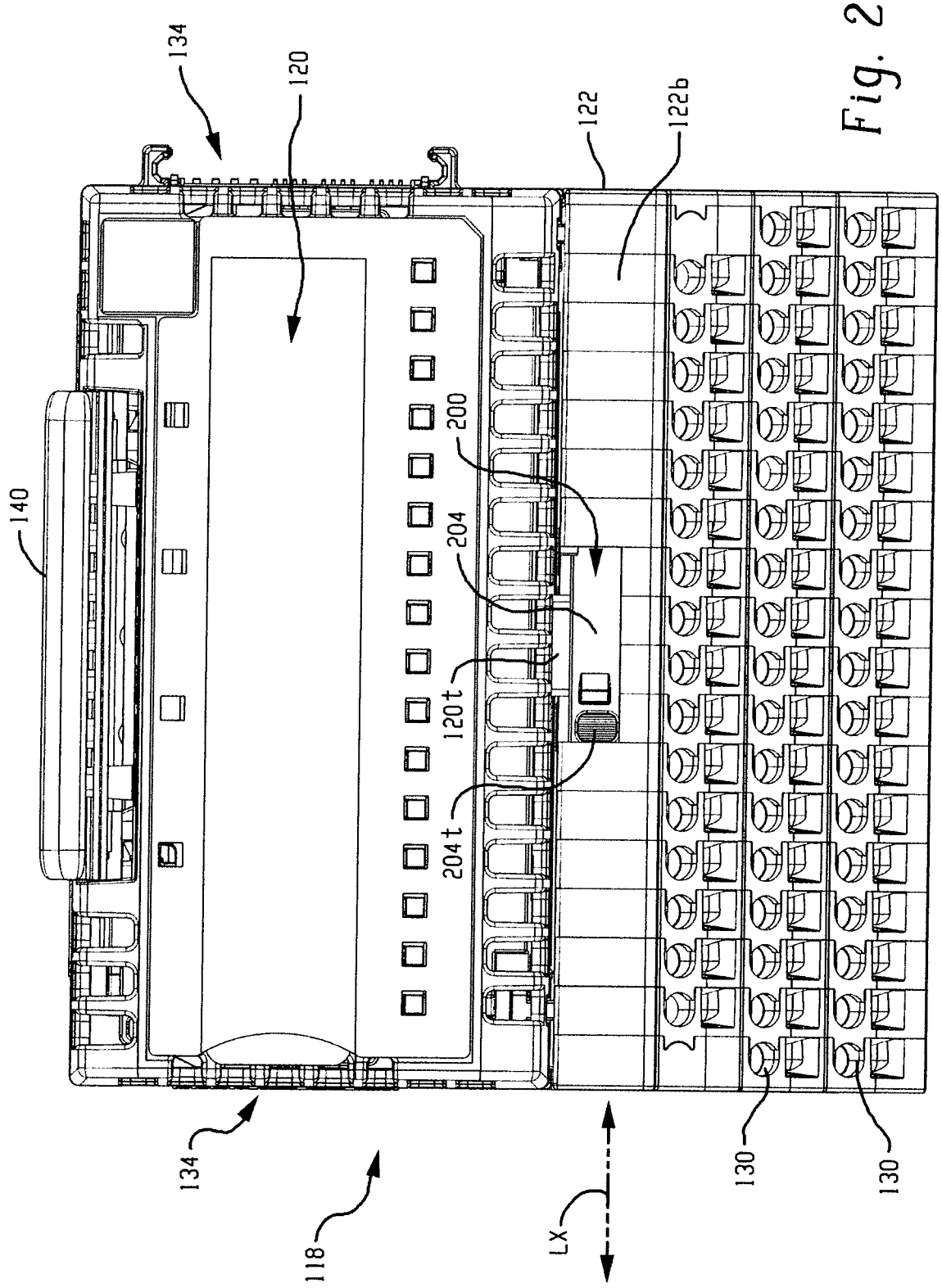

FIGS. 2A and 2B correspond respectively to FIGS. 1A and 1B, but show the movable latch 200 in its latched position in which the sliding latch 200 captures the I/O module 120 in its installed operative position on the terminal base 122. The terminal base 122 includes a recess 132 or other structure for being mounted on a DIN rail or other support structure, with multiple adjacent terminal bases 122 physically and electrically connected through upstream and downstream backplane electrical connectors 134 that communicate power and data to and from the interconnected terminal bases 122 and the I/O modules 120 respectively connected thereto.

The terminal base 122 comprises a terminal block 122b that includes a plurality of wiring terminals 130 corresponding to the wiring terminals 30 of the I/O device 18 described in the '110 patent for connecting to the field wiring of sensors, actuators, and other field devices of a controlled machine and/or process such that the field devices provide input data to and receive output data and/or commands from the I/O module 120 of the I/O device 118 through the terminals 130 of the terminal block. The I/O module includes electronic input and output circuits contained therein for sending, receiving, and/or otherwise processing data to be sent to and/or received from the sensors, actuators, and other industrial automation field devices connected thereto through the electrical connectors 130 of the terminal block 122b.

Unlike the I/O device 18 of the '110 patent, however, the terminal block 122b of the I/O device 118 comprises a movable latch 200 connected thereto and movable between its unlatched position (FIGS. 1A & 1B) and its latched position (FIGS. 2A & 2B). The terminal block 122b comprises a latching slot 202 defined therein and located adjacent an upper front edge of the terminal block 122b that is located adjacent the installed I/O module 120. The movable latch 200 comprises a flat or otherwise shaped latch body 204 at least partially located in the slot 202 and slidable or otherwise movable in the latching slot 202 between its unlatched and latched positions. A latch actuator tab 204t is connected to the latch body 204 and projects outwardly from the latching slot 202 and is positioned to be grasped by a user's fingers or otherwise engaged by a user for manual sliding or other manual movement of the latch body 204 between its unlatched and latched positions. In its latched position, the latch body 204 is inserted into and obstructs or at least partially obstructs the latching slot 202, while in its unlatched position, the latch body 204 is withdrawn or at least partially withdrawn from the latching slot 202 to open or at least partially open the latching slot 202.

Figure 4:
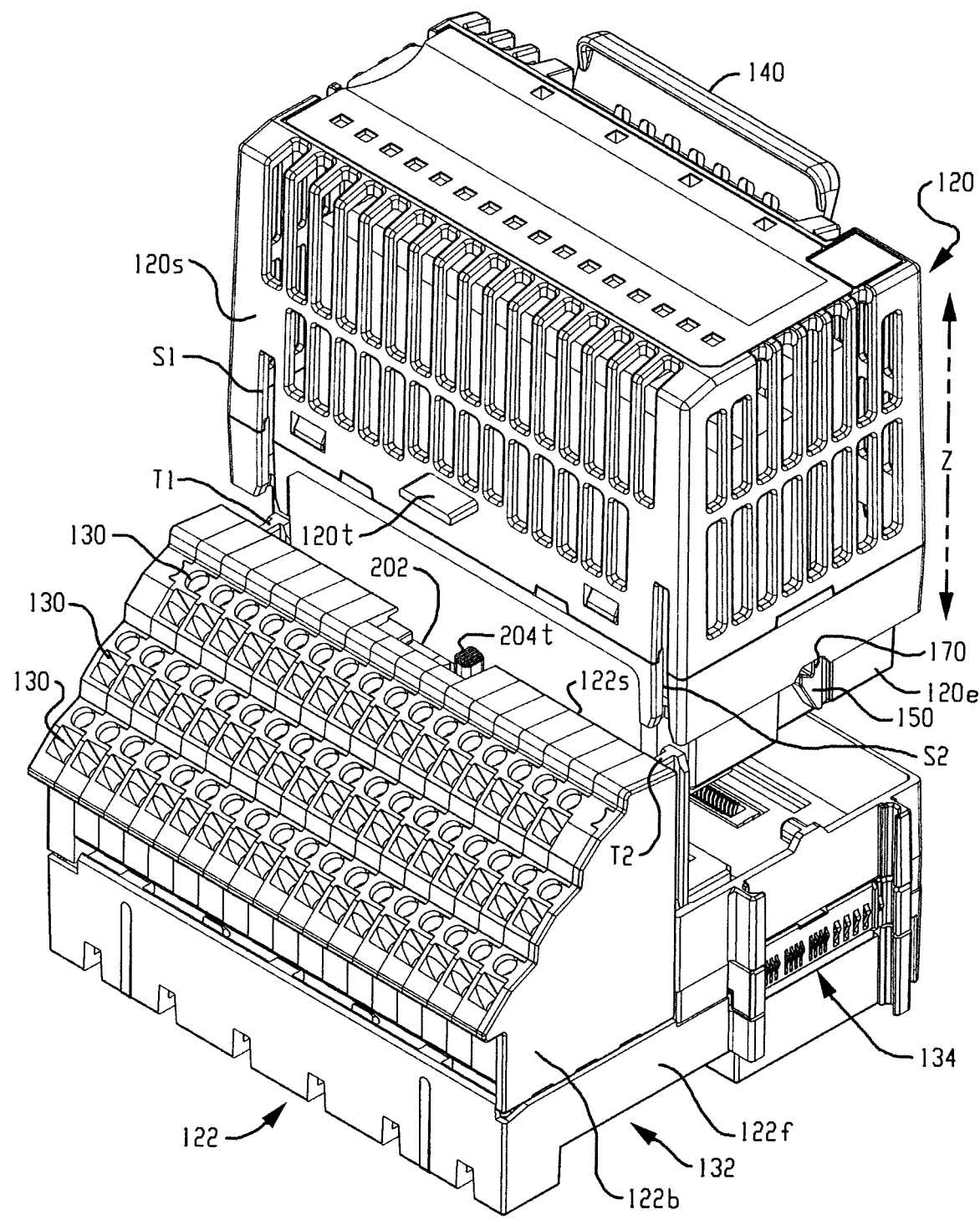
FIG. 4 is a partially exploded isometric view of the I/O device of FIG. 1A showing installation and removal the I/O module portion thereof.

The I/O module 120, itself, differs from the I/O module 20 disclosed in the '110 patent in that the I/O module 120 comprises a locking tab 120t connected thereto (see also the partially exploded view of FIG. 4). The locking tab 120t is dimensioned and located so as to be received in the latching slot 202 of the terminal block 122b when the I/O module 120 is operatively installed in the terminal base 122 as shown in FIGS. 1A & 1B (the movable latch 200 must be positioned in its unlatched position as shown in FIGS. 1A & 1B for the locking tab 120t of the I/O module 120 to be fully received in the latching slot 202). The locking tab 120t projects outwardly relative to the I/O module 120 from a lower wall 120S of the I/O module that lies adjacent the terminal block 122b. When the I/O module 120 is fully operatively installed on the terminal base 122 and the locking tab 120t is seated in the latching slot 202 and located adjacent the movable latch 200, the latch 200 is moved from its unlatched position to its latched position (FIGS. 2A & 2B) to engage the locking tab 120t so that the latch body 204 at least partially covers or overlies the locking tab 120t and the locking tab 120t is captured in the latching slot 202 between the latch body 204 and the terminal base 122b as shown in the sectioned view of the terminal base 122b provided in FIG. 3.

The I/O module 120 includes a peripheral edge 120e (FIG. 4) that is engaged with the terminal base 122 when the I/O module 120 is operatively connected to the terminal base 122 adjacent the terminal block 122b. As such, when the movable latch 200 is engaged to capture the locking tab 120t of the I/O module 118 in the latching slot 202, the I/O module 120 is immovably captured on the terminal base 122 and the locking tab 120t cannot escape the latching slot 202.

To remove the I/O module 120 from the terminal base 122, the movable latch 200 is slid or otherwise moved to its unlatched position (FIGS. 1A & 1B) along the latching axis LX so that the movable latch 200 is disengaged from and moved away from the locking tab 120t to release the locking tab 120t. The known latch release lever 140 described in the '110 patent is then manually operated to release the latch element 170 so that the I/O module 120 can be pulled away from the terminal base 122 by linear movement of the I/O module 120 along the linear module insertion/removal axis Z as shown in FIG. 4. The latching axis LX is oriented perpendicularly relative to the module insertion/removal axis Z.

Those of ordinary skill in the art will recognize that the movable latch 200 provides a simple and effective mechanism for selectively operatively securing an I/O module 120 to the terminal base 122. An I/O device 118 including a movable latch 200 according to the present development can optionally eliminate the known latch element 170 and its release lever 140, and the movable latch 200 can be used as the primary constraint to capture the removable I/O module 120 in its operative position on the terminal base 122. Elimination of the latch element 170 and release lever 140 simplifies the structure, reduces parts and assembly costs, and increases the space inside the I/O module 120 for circuitry and other operative components.

Because the movable latch 200 is connected to the terminal block 122b instead of the I/O module 120, the I/O module 120 can be designed to mate with the terminal base 122 in any desired orientation and the I/O module 120 can have any desired shape, provided that the I/O module 120 includes one or more locking tabs 120t to be received in the latching slot 202 of the terminal base 122 when the I/O module 120 is operatively installed on the terminal base 122.

As also shown in FIG. 4, to further secure the I/O module 120 to the terminal base 122, the terminal block 122b portion of the terminal base 120 comprises at least one and preferably first and second parallel, spaced-apart I/O module retaining rails or projections T1,T2 that are respectively slidably received into and engaged with corresponding parallel, spaced-apart first and second retaining slots S1,S2 located in or provided on the I/O module 120. The retaining slots S1,S2 are located in the I/O module 120 in/on the lower wall or lower side 120S that is oriented toward and that lies adjacent an upper side or upper wall 122S of the terminal block 122b. The locking tab 120t is located between the first and second slots S1,S2 on the lower wall 120S of the I/O module 120.

Figure 5:
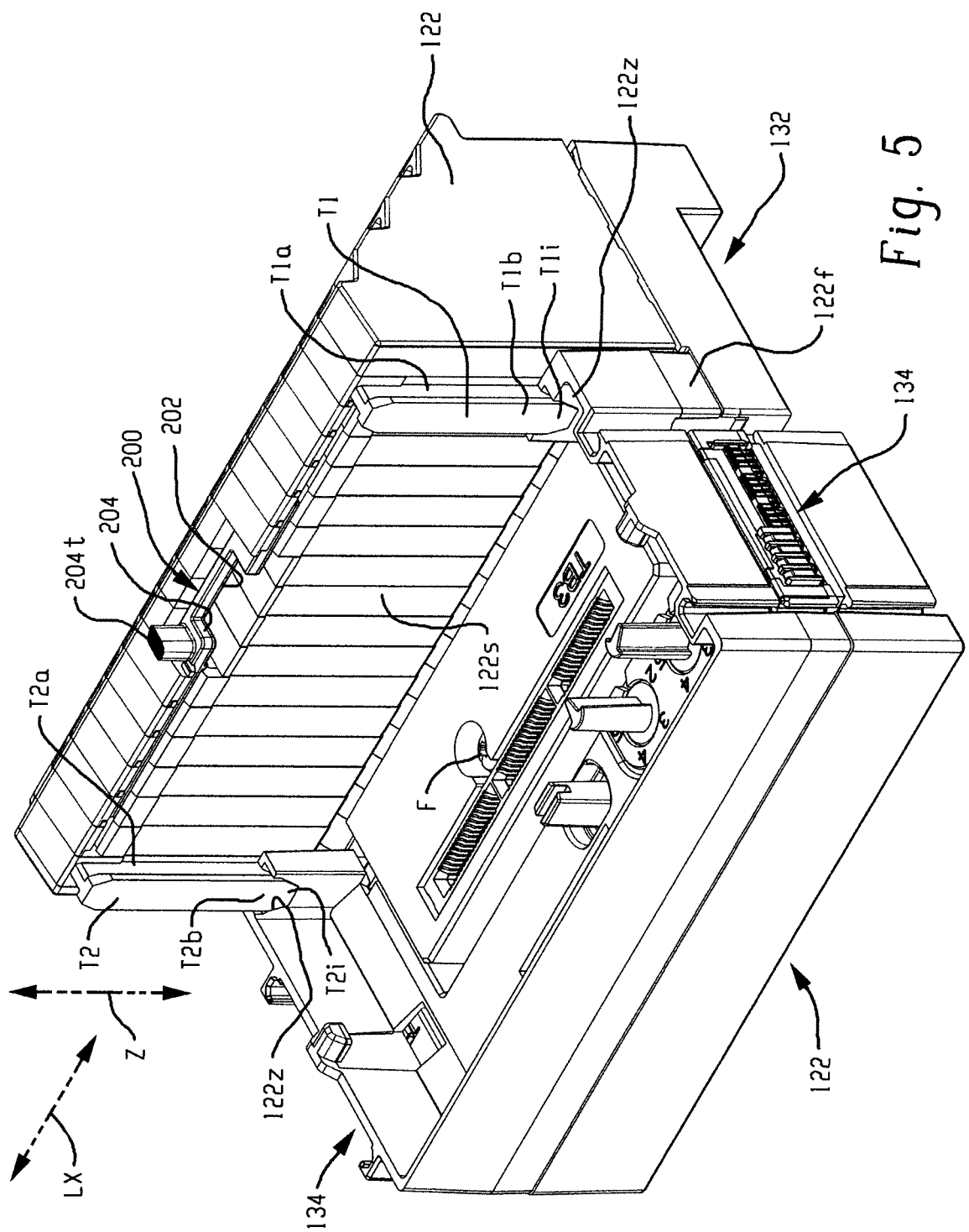
FIG. 5 provides a rear isometric view of the terminal base portion of the I/O device of FIG. 1A by itself.

Referring also to FIG. 5, which provides an isometric view of the terminal base 122 by itself, it can be seen that the module retaining projections T1,T2 project outwardly relative to the upper side or upper wall 122S of the terminal block 122b. Each projection T1,T2 comprises a respective support leg T1a,T2a that projects outwardly from the upper side or upper wall 122S of the terminal block 122b. Each projection T1,T2 also includes a respective transverse flange T1b,T2b connected to an outer end of the corresponding support leg T1a,T2a so that the transverse flange T1b,T2b is spaced from the upper wall 122S of the terminal block 122b. Each transverse flange T1b,T2b is oriented transversely relative to an outer end of the corresponding support leg T1a,T2a such that each projection T1,T2 defines a T-shaped cross-section or profile along the insertion/removal axis Z (as shown herein) or an L-shaped cross-section or profile. Each projection T1,T2 and its corresponding slot S1,S2 also extends along an axis that lies parallel to an I/O module insertion/removal axis Z along which the I/O module 120 is moved during installation and removal relative to the terminal base 122.

Referring particularly to FIGS. 2A & 4, when the I/O module 120 is operatively installed on the terminal base 122, the module retaining projections T1,T2 are respectively slidably received in the first and second retaining slots S1,S2 of the I/O module 120 and at least part of the lower side or lower wall 120S of the I/O module 120 adjacent each of the slots S1,S2 is engaged by and captured between the transverse flange T1*b*,T2*b* and the upper wall 122S of the terminal block 122*b* such that the I/O module 120 is captured adjacent the upper wall 122S of the terminal block 122*b* and is prevented from moving relative to the terminal base 122 in any direction except along the module insertion/removal axis Z, i.e., engagement of the module retaining projections T1,T2 in the retaining slots S1,S2 prevents movement of the I/O module 120 away from the upper wall 122S of the terminal block 122*b* in a direction perpendicular or otherwise transverse to the module insertion/removal axis Z. When the I/O module 120 is operatively installed on the terminal base 122, at least part of the lower side or lower wall 120S of the I/O module 120 lies adjacent the upper side or upper wall 122S of the terminal block 122*b*.

When the I/O module 120 is operatively installed on the terminal base 122, the peripheral edge 120*e* of the I/O module 120 is mated with the terminal base 122, the retaining slots S1,S2 are mated with the module retaining projections T1,T2, and the locking tab 120*t* of the I/O module 120 is captured in the latching slot 202 by the movable latch 200, whereby the I/O module 120 is prevented from moving in any linear direction relative to the terminal base 122 and is prevented from rotating relative to the terminal base 122 in response to rotational forces. For this reason, an I/O module 120 according to the present development can omit the latch element 170 and release lever 140 (corresponding to the latch element 70 and release lever 40 of the I/O module 18 disclosed in the '110 patent).

Figure 6:
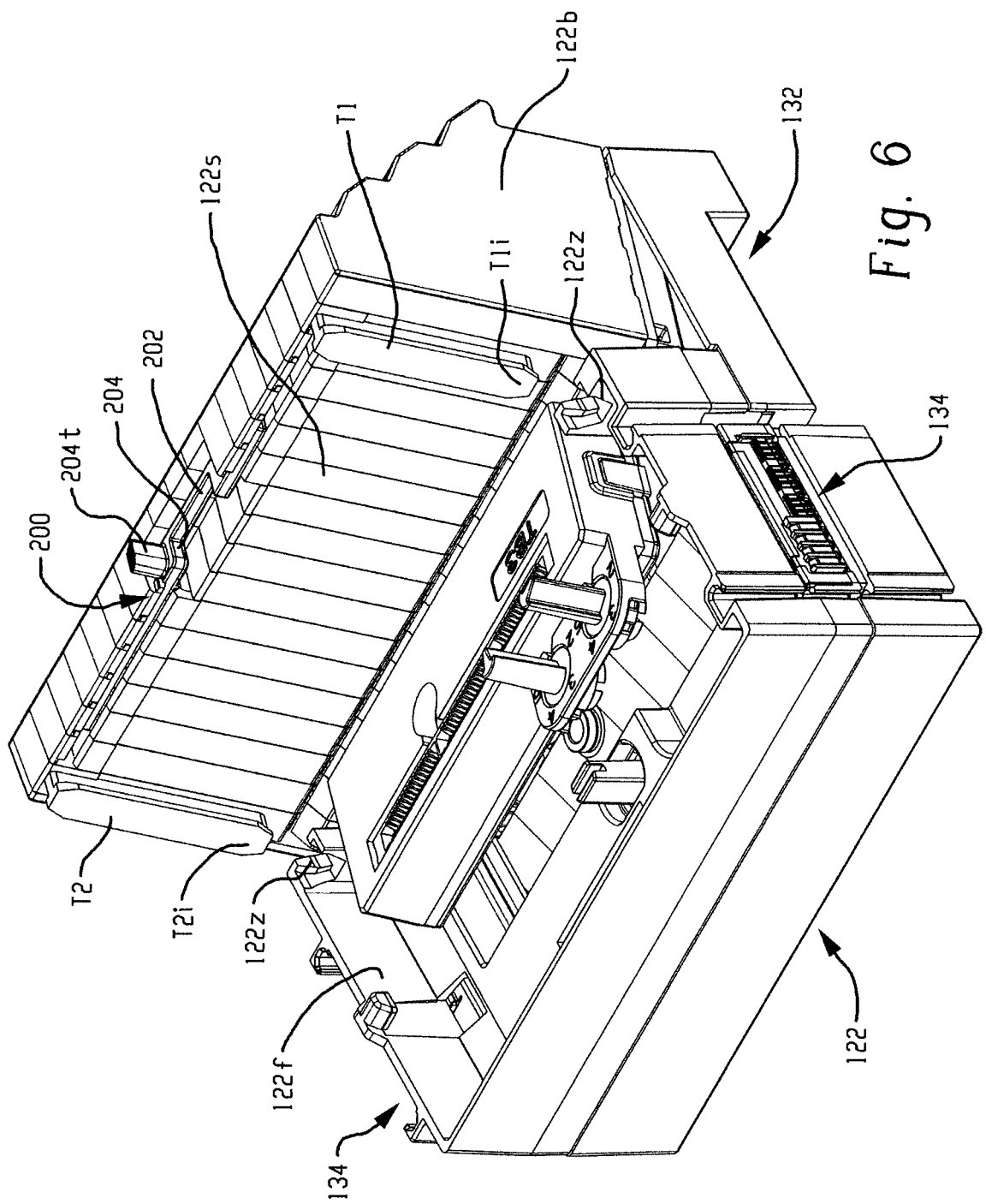
FIG. 6 is similar to FIG. 5, but shows the terminal base 122 partially disassembled.

FIG. 6 is similar to FIG. 5, but shows the terminal base 122 partially disassembled. In FIGS. 5 & 6, it can be seen that the terminal base 122 includes a base or frame 122*f* and the terminal block 122*b* that is connected to the frame 122*f*. To facilitate proper alignment during assembly and to increase the rigidity of the assembled terminal base 122, the frame 122*f* includes first and second notches 122*z* that respectively receive projecting inner ends T1*i*,T2*i* of the module retaining projections T1,T2 when the terminal block 122*b* is installed on the frame 122*f* to assemble the terminal base 122. In the illustrated example, a screw fastener F is used to secure the terminal block 122*b* to the frame 122*f* when the terminal base 122 is assembled, but any other suitable fastener can alternatively be used.

The I/O device 118 exhibits improved reliability and performance relative to known I/O devices such as the I/O device 18 described above and others, especially in environments where the I/O device is subjected to significant shock and vibration. For example, the I/O device 118 is more resistant to shock and vibration relative to all axes of movement, i.e., X,Y,Z axes of movement. Furthermore, the present development provides increased rigidity to the I/O device overall, which improves its performance and also its feel to an end-user. Also, an I/O device 118 according to the present development can eliminate an existing latch assembly of the known I/O device 18 so as to reduce the cost of components, reduce assembly costs, and free-up space for other electrical components, airflow vents, and other features.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An input/output device comprising:
   a terminal base adapted to be mounted to an associated support structure;
   a terminal block connected to the terminal base, said terminal block including a plurality of wiring terminals adapted to be electrically connected to associated input/output device field wiring;
   a latch comprising a latch body connected to the terminal block, said latch body manually movable to and between an unlatched position and a latched position;
   an input/output module connected to the terminal base adjacent the terminal block, said input/output module comprising a locking tab connected thereto;
   wherein said latch body, when in said latched position, engages the locking tab of the input/output module and captures the input/output module to the terminal block; and,
   wherein said latch body, when in said unlatched position, is disengaged from the locking tab to allow said input/output module to be disconnected from said terminal block;
   said latch further comprises a latching slot provided in said terminal block adjacent said input/output module;
   said locking tab of said input/output module is received in said latching slot; and,
   said latch body at least partially located in said latching slot and movable in said latching slot between said latched and unlatched positions said latch body at least partially overlies the locking tab to capture the locking tab in the latching slot of the terminal block between the latch body and the terminal block when the latch body in located in its latched position.

2. The input/output device as set forth in claim 1, wherein said latch body moves in a reciprocal linear manner along a latching axis when said latch body moves between its latched and unlatched positions.

3. The input/output device as set forth in claim 2, wherein said latch further comprises an actuator tab that is connected to the latch body and that projects outwardly from the latching slot such that the actuator tab is adapted to be engaged by a user's fingers for manual reciprocal linear movement of the latch body between its latched and unlatched positions along the latching axis.

4. The input/output device as set forth in claim 3, wherein said input/output module is selectively installed on and removed from the terminal base by linear movement of the input/output module along a module insertion/removal axis that is oriented perpendicularly to the latching axis.

5. The input/output device as set forth in claim 1, wherein:
   said input/output module is selectively installed on and removed from the terminal base by linear movement of the input/output module along a module insertion/removal axis; and,
   said latch body moves between its latched and unlatched positions in a reciprocal linear manner along a latching axis that is oriented transversely relative to said module insertion/removal axis.

6. The input/output device as set forth in claim 5, further comprising:
at least one module retaining projection connected to said terminal block;
at least one corresponding retaining slot provided on the input/output module;
wherein said at least one module retaining projecting is received in said at least one corresponding retaining slot when said input/output module is operatively installed on the terminal base, and wherein said at least one module retaining projection engages said input/output module and prevents movement of said input/output module relative to said terminal base in any direction except along the module insertion/removal axis.

7. The input/output device as set forth in claim 6, wherein said at least one module retaining projection and said at least one corresponding retaining slot extend along respective axes that lie parallel to the module insertion/removal axis.

8. The input/output device as set forth in claim 1, wherein:
said latch body moves in a reciprocal linear manner along a latching axis when said latch body moves between its latched and unlatched positions;
said latch further comprises an actuator tab that is connected to the latch body and that projects outwardly from the latching slot such that the actuator tab is adapted to be engaged by a user's fingers for manual reciprocal linear movement of the latch body between its latched and unlatched positions along the latching axis.

9. The input/output device as set forth in claim 8, wherein:
said input/output module is selectively installed on and removed from the terminal base by linear movement of the input/output module along a module insertion/removal axis that is oriented perpendicularly to the latching axis;
said locking tab projects outwardly from a lower wall of the input/output module that lies adjacent said terminal block;
said latch further comprises a latching slot provided in said terminal block adjacent said lower wall of said input/output module;
said locking tab of said input/output module is received in said latching slot; and,
said latch body at least partially overlies the locking tab to capture the locking tab in the latching slot of the terminal block between the latch body and the locking tab when the latch body in located in its latched position.

10. An input/output device comprising:
a terminal base adapted to be mounted to an associated support structure;
a terminal block connected to the terminal base, said terminal block including a plurality of wiring terminals adapted to be electrically connected to associated input/output device field wiring;
a latch comprising a latch body connected to the terminal block, said latch body manually movable to and between an unlatched position and a latched position;
an input/output module connected to the terminal base adjacent the terminal block, said input/output module comprising a locking tab connected thereto;
wherein said latch body, when in said latched position, engages the locking tab of the input/output module and captures the input/output module to the terminal block; and,
wherein said latch body, when in said unlatched position, is disengaged from the locking tab to allow said input/output module to be disconnected from said terminal said input/output module is selectively installed on and removed from the terminal base by linear movement of the input/output module along a module insertion/removal axis; and,
said latch body moves between its latched and unlatched positions in a reciprocal linear manner along a latching axis that is oriented transversely relative to said module insertion/removal axis;
at least one module retaining projection connected to said terminal block;
at least one corresponding retaining slot provided on the input/output module;
wherein said at least one module retaining projecting is received in said at least one corresponding retaining slot when said input/output module is operatively installed on the terminal base, wherein said at least one module retaining projection engages said input/output module and prevents movement of said input/output module relative to said terminal base in any direction except along the module insertion/removal axis;
wherein said at least one module retaining projection and said at least one corresponding retaining slot extend along respective axes that lie parallel to the module insertion/removal axis;
wherein said at least one module retaining projection comprises:
(i) a support leg that projects outwardly from an upper wall of the terminal block and that extends parallel to the module insertion/removal axis; and,
(ii) a transverse flange connected to an outer end of the support leg that is spaced from the upper wall of the terminal block.

11. The input/output device as set forth in claim 10, wherein support leg and said transverse flange define a T-shaped cross-section.

12. The input/output device as set forth in claim 10, wherein:
said at least one module retaining projection comprises first and second parallel, spaced-apart module retaining projections;
said at least one corresponding retaining slot comprises first and second parallel, spaced-apart retaining slots; and,
said first and second retaining projections are received respectively in said first and second retaining slots when said input/output module is connected to said terminal base.

13. The input/output device as set forth in claim 12, wherein said terminal base further comprises a frame to which said terminal block is connected and comprises a fastener that is engaged with said terminal block and said frame to secure said terminal block to said frame.

14. The input/output device as set forth in claim 13, wherein said frame of said terminal base comprises first and second notches, and wherein said first and second module retaining projections comprise respective inner ends that are respectively received in the first and second notches to facilitate proper alignment between said frame and said terminal block and to increase rigidity of said terminal base.

15. A terminal base for an I/O device, said terminal base comprising:
a terminal block including a plurality of wiring terminals adapted to be electrically connected to associated input/output device field wiring;

a latch provided on said terminal block, said latch comprising: (i) a slot provided on said terminal block; and (ii) a latch body located in the slot and manually movable to and between an unlatched position and a latched position;

wherein said latch body obstructs said slot when said latch body is located in said latched position and said latch body at least partially withdrawn from said slot to open said slot when said latch body is located in its unlatched position.

16. The terminal base for an I/O device as set forth in claim 15, wherein said latch body slides along a linear path between said latched and unlatched positions, said latch body comprising a latch actuator tab that projects outwardly from the latch body and that is adapted to be manually engaged by a user to move said latch body between its latched and unlatched positions.

17. The terminal base for an I/O device as set forth in claim 15, further comprising first and second spaced-apart module retaining projections connected to a wall of the terminal block, said first and second module retaining projections each comprising: (i) a support leg that projects outwardly from the wall of the terminal block, wherein the support legs of the first and second module retaining projections are arranged parallel to each other; and, (ii) a transverse flange connected to an outer end of the support leg that is spaced from the wall of the terminal block.

18. The terminal base for an I/O device as set forth in claim 17, further comprising:

a frame to which said terminal block is releasably connected;

a fastener that is engaged with said terminal block and said frame to secure said terminal block to said frame.

19. The terminal base for an I/O device as set forth in claim 18, wherein said frame of said terminal base comprises first and second notches, and wherein said first and second module retaining projections comprise respective inner ends that are respectively received in the first and second notches to facilitate proper alignment between said frame and said terminal block and to increase rigidity of said terminal base.

* * * * *